United States Patent
Goossen et al.

[11] Patent Number: 5,897,333
[45] Date of Patent: Apr. 27, 1999

[54] METHOD FOR FORMING INTEGRATED COMPOSITE SEMICONDUCTOR DEVICES

[75] Inventors: Keith Wayne Goossen, Aberdeen; James A. Walker, Howell, both of N.J.

[73] Assignee: Lucent Technologies, Inc., Murray Hill, N.J.

[21] Appl. No.: 08/818,813

[22] Filed: Mar. 14, 1997

[51] Int. Cl.⁶ .............................. H01L 21/30; H01L 21/46
[52] U.S. Cl. .................... 438/455; 438/459; 438/977; 148/DIG. 135
[58] Field of Search ............................ 438/455, 459, 438/977, 485; 148/DIG. 135

[56] References Cited

U.S. PATENT DOCUMENTS

| | | |
|---|---|---|
| 3,970,819 | 7/1976 | Gates et al. . |
| 5,234,535 | 8/1993 | Beyer et al. . |
| 5,573,960 | 11/1996 | Izumi et al. . |
| 5,591,678 | 1/1997 | Bendik . |
| 5,741,733 | 4/1998 | Bertagnolli et al. . |

OTHER PUBLICATIONS

Tummala, Tao; Rymaszewski, Eugene; and Klopfenstein, Alan; Microelectronics Packaging Handbook Part III, Chapman and Hall, p. 515, 1997.

*Primary Examiner*—John F. Niebling
*Assistant Examiner*—Josetta I. Jones

[57] ABSTRACT

In an improved method for manufacturing an integrated composite semiconductor device according to the present invention, a semiconductor-based stop-etch layer having holes therein at selected sites is disposed over the epoxy or other flowable hardener used in flip-chip bonding. The hardener underneath the openings in the stop-etch layer is subtantially removed via a dry etch applied therethrough, exposing desired structure, such as bonding pads, formerly covered by the hardener. The epoxy underneath the stop-etch layer is substantially preserved.

19 Claims, 3 Drawing Sheets

METHOD FOR FORMING INTEGRATED COMPOSITE SEMICONDUCTOR DEVICES

FIELD OF THE INVENTION

The present invention relates to the bonding of fully-fabricated semiconductor devices onto other fully-fabricated semiconductor devices so as to produce integrated units.

BACKGROUND OF THE INVENTION

Flip-chip bonding is a process by which a first semiconductor chip and a second semiconductor chip, both including fully-fabricated semiconductor devices, can be bonded together. According to the steps of the process, semiconductor chips are bonded together, and a flowble hardener, such as epoxy, is flowed between the bonded chips and allowed to harden. The substrate of the first chip can then be removed, if desired, such as to provide an unimpeded optical path to and from semiconductor optical components disposed thereon.

For substrate removal, acid, or other suitable etchant, is applied to the "back-side", i.e., the substrate-side, of the first chip. The etch removes the substrate but is prevented from attacking the semiconductor devices by a suitable stop-etch layer that is formed between the substrate and the device layers. The resulting structure has a plurality of semiconductor devices in a bed of hardener on the second chip. The mechanical integrity of the semiconductor devices is improved due to the surrounding hardener. Each semiconductor device is capped by a stop-etch layer. See U.S. Pat. Nos. 5,385,632 and 5,578,162.

Notwithstanding the benefits to the integrated structure, the hardener between the semiconductor devices may be subsequently removed in order to expose flip-chip bonding sites on the second chip so that additional chips may be bonded thereto. The hardener, if epoxy, can be removed by a dry etch. See, Ser. No. 08/766,214. Moreover, hardener removal may be necessary to access electrical probe pads or wire-bonding sites on the second chip. In particular, if several circuit designs, each requiring its own wire-bond pads, are aggregated onto a single die that is sectioned after processing, the hardener covering such wire-bond pads must be removed. Standard etch masks, such as photoresist, will not resist the hardener etch, so that such masks will not be able to protect underlying structure while the wire-bond pads are exposed. Thus, there is a need for a method to selectively remove the hardener underfill used when flip-chip bonding with substrate removal.

SUMMARY OF THE INVENTION

In a method according to the present invention, a semiconductor-based stop-etch layer is disposed over the epoxy or other flowable hardener used in flip-chip bonding except at locations at which the epoxy is to be removed. The stop-etch layer may suitably be patterned using standard photoresists masks since semiconductor-attacking etches do not appreciably attack photoresist. The epoxy underneath the openings in the stop-etch layer is substantially removed via a dry etch, exposing desired structures. The epoxy underneath the stop-etch layer is substantially preserved. The stop-etch layer is then substantially removed by an etchant that does not attack the epoxy, and may be timed or otherwise controlled so that the underlying device layers are substantially preserved.

The method advantageously provides a method for bulk manufacturing of a variety of different circuits on a single die or wafer.

BRIEF DESCRIPTION OF THE DRAWINGS

Features of the invention will become more apparent from the following detailed description of specific embodiments thereof when read in conjunction with the accompanying drawings, in which.

DETAILED DESCRIPTION

Attaching semiconductors chip using flip-chip bonding methods and improvements thereof is described in U.S. Pat. Nos. 5,385,632 and 5,578,162, and U.S. patent application Ser. No. 08/766,214. The aforementioned patents and application are incorporated herein by reference. The present invention is an improvement of those methods, and finds particular utility in the batch processing of a group of separate semiconductor circuits on a single die or wafer.

Figure 1:
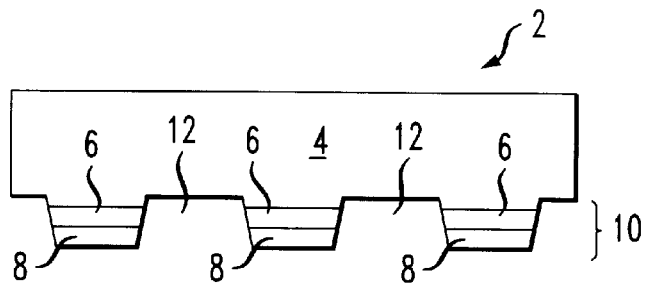
FIG. 1 is an illustration of a semiconductor chip after mesa formation, wherein the chip is used in conjunction with existing flip-chip bonding methods.
Figure 2:
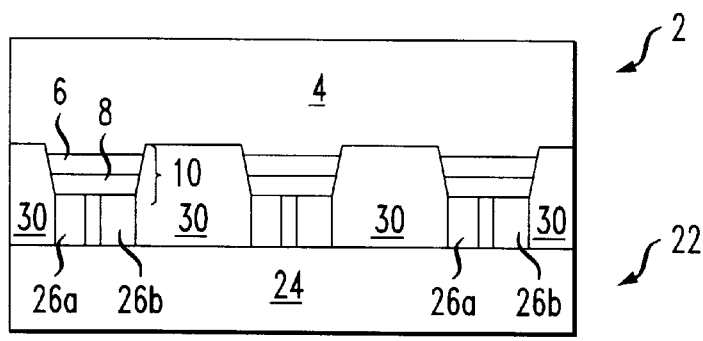
FIG. 2 is an illustration of two bonded chips according to existing flip-chip bonding methods, after flowable hardener has been applied and hardened.
Figure 3:
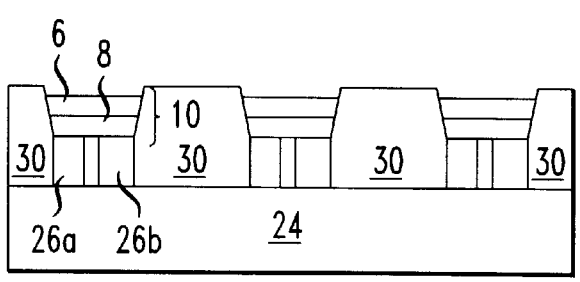
FIG. 3 shows the bonded chips of FIG. 2 after substrate removal from one of the chips.

According to the existing flip-chip bonding method, illustrated in FIGS. 1–3, a first chip is bonded to a second chip. The first chip 2 comprises a substrate 4, a stop-etch layer 6 disposed on the substrate, and a plurality of device layers 8 (shown for simplicity as a single layer) disposed on the stop-etch layer. Before bonding the chips, mesas 10 are formed on the first chip 2 by etching through the device layers and the stop etch layer in discrete regions 12. The resulting structure, illustrated in FIG. 1, comprises a plurality of discrete mesas 10 capped by semiconductor device layers 8 each forming a semiconductor device such as, for example, a multiple quantum well modulator.

The second chip 22, which can be, for example, a silicon electronics chip, comprises a substrate 24, silicon electronics, not shown, and bonding sites 26a and 26b, typically two sites for each mesa 10, for receiving the mesas from the first chip 2. The mesas 10 on the first chip and the bonding sites 26a, 26b on the second chip are then aligned and bonded, preferably using thermocompression bonding. Metallized bonding pads, not shown, are typically provided on the mesas 10 to facilitate bonding.

Aided by capillary action, an etch resist or flowable hardener 30, which is preferably an epoxy, is flowed between the spaces that are formed between the substrates. The flowable hardener is allowed to harden. The resulting structure is shown in FIG. 2.

After the flowable hardener hardens, the substrate 4 of the first chip 2 is removed. In preferred embodiments, a jet etcher is used for substrate removal. Etchant is selected to etch the substrate but not the stop etch layer. FIG. 3 shows the structure that results after removing the substrate 4 from the first chip 2. Preferably, the flowable hardener 30 between the mesas 10 is exposed, i.e., is not covered by any layers, since it may swell or contract during operational thermal cycling.

Figure 4:
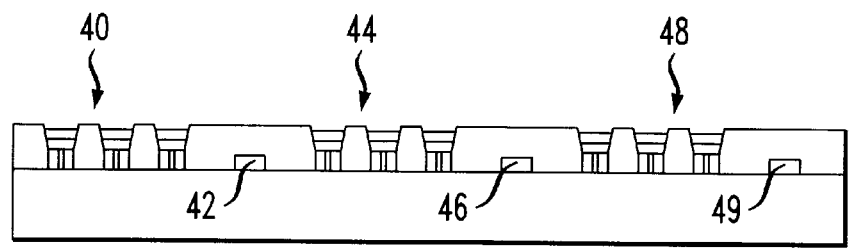
FIG. 4 shows semiconductor devices comprising several circuits disposed on a single wafer.

It would be desirable to have the ability to aggregate several different circuit designs 40, 44 and 48 onto a single die or chip to minimize manufacturing costs. Such an arrangement is illustrated in FIG. 4. After processing, such different circuits would be mechanically separated, such as by sawing, and used for different applications. Such circuits may each require their own wire-bond pads 42, 46 and 49. The flowable-hardener 30 covering such wire-bond pads must be substantially removed before using such circuits in their intended applications.

A conventional approach to removing the flowable hardener would be to apply a standard etch mask, such as photoresist, using photolithographic techniques, over the hardener surface. The problem with that approach is that such standard etch masks will be attacked by the etchant that is used to etch the underlying hardener. Thus, undesirably, hardener located in the regions between semiconductor devices would be substantially removed sacrificing the mechanical integrity benefits realized from the hardener. Moreover, etchant useful for removing hardener can attack oxides. As such, once the etchant removes the hardener, it can attack electronic circuitry residing thereunder. As such, it is desirable, if not necessary, to etch the hardener only at locations overlying features that must be exposed, such as wire bond pads.

The flowable-hardener etchant does not susbstantially attack semiconductor layers. The present inventors have recognized, in a modification of the existing flip-chip bonding method, that the stop-etch layer should not be removed during mesa formation except above sites where, on the second chip, the flowable hardener 30 will be removed. A conventional photoresist mask can be used to pattern openings in the semiconductor layers since semiconductor etchants do not attack photoresist appreciably. The hardened flowable hardener 30 is then removed through the openings in the stop-etch layer. Advantageously, hardened flowable hardener 30 that is beneath the stop-etch layer is substantially preserved. The present invention is described in more detail below in conjunction with FIGS. 5–9.

Typically, one of the chips to be bonded will contain gallium-arsenide (GaAs)-based or indium-phosphide (InP)-based optical components, such as a p-i-n diode, a surface emitting laser (SEL) or a quantum well modulator (MQW). The other chip will typically be a silicon-electronics chip. It should be understood, however, that the invention is generally applicable to other types of chips.

Figure 5:
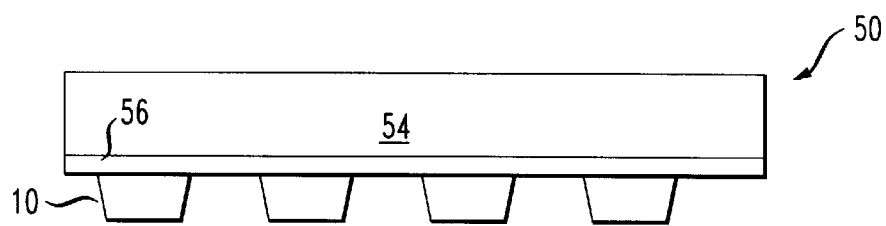
FIG. 5 shows an intermediate structure formed using the present method wherein the stop-etch layer forms a continuous layer over the hardened flowable hardener.

FIG. 5 shows mesas 10 etched in a first chip 50. In the existing process, when the mesas are etched, the etch proceeds through the stop-etch layer 56 in the region between the mesas. According to the present invention, however, the etch is timed so that the portion of the stop-etch layer 56 between mesas is not etched.

The stop-etch layer, which is typically a compound semiconductor, can be lattice-matched to substrate 54 to prevent delamination or device defects. The stop-etch layer 56 can be, for example, AlGaAs, InGaP, InGaAlP and InAlP if the substrate 54 is GaAs. For Inp-based substrates, InGaAs can suitably be used as a stop-etch layer. An acidic hydrogen peroxide solution, or other solutions known to those skilled in the art for suitably etching the device layers to form the mesas 10 can be used.

Figure 6:
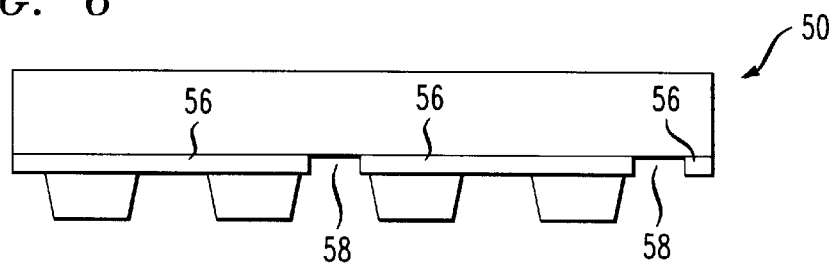
FIG. 6 shows an intermediate structure formed using the present method wherein openings are patterned at selected locations in the stop-etch layer.

FIG. 6 shows the chip 50 after holes 58 have been patterned in the stop-etch layer 56. A conventional photoresist mask can be used for patterning the holes 58 since etchants useful for etching the semiconductor-based stop-etch layer 56 will not attack photoresist appreciably. The location of the holes 58 are dictated by the location of structures, such as bonding pads, residing on a second chip 60 to which the chip 50 will be attached.

Figure 7:
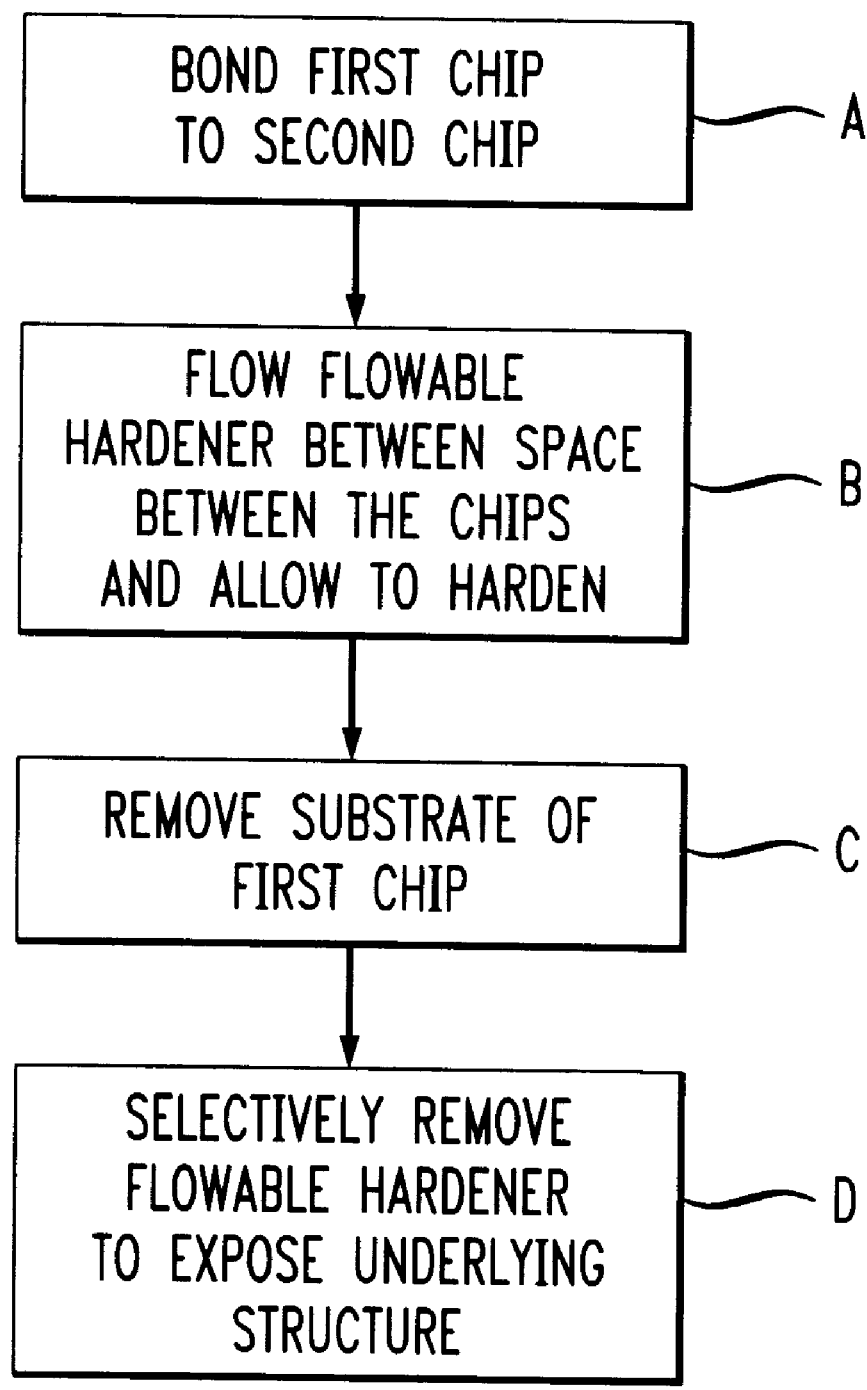
FIG. 7 is a flow-diagram illustrating an embodiment of the present method.

After the chip 50 has been prepared as described above, the chips 50 and 60 are attached according to existing flip-chip bonding methods, as indicated in FIG. 7, operation A. The holes 58 in the stop-etch layer 56 align with structures 62, such as wire-bond pads, on the chip 60.

Figure 8:
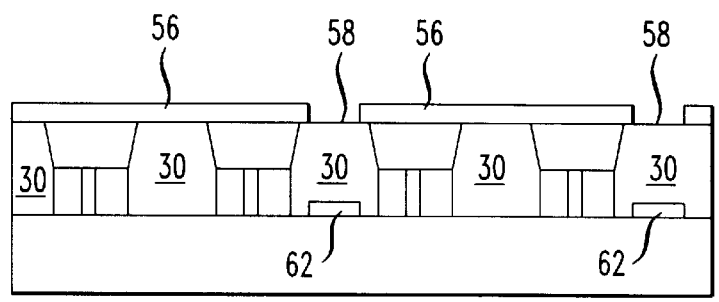
FIG. 8 shows the structure of FIG. 6 with the substrate removed.

According to operation B, a flowable hardener 30, preferably epoxy, is flowed between the chips and allowed to harden. The substrate 54 can then be substantially removed, as indicated in operation C of the present method. It is within the capabilities of those skilled in the art to select an etchant suitable for etching the substrate 54. For a GaAs substrate, the etchant can be, for example, 100:1 $H_2O_2$:$NH_4OH$. The structure resulting after substrate removal is shown in FIG. 8. While the substrate etchant does not attack a flowable hardener 30 such as epoxy to an appreciable degree, the holes 58 in the stop-etch layer 56 can be filled with a dielectric material, such as silicon nitride or silicon oxide, to provide an additional measure of protection to the hardener 30.

Figure 9:
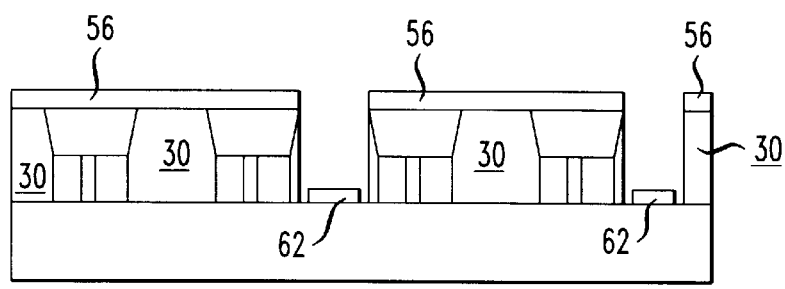
FIG. 9 shows the structure of FIG. 8 with selected regions of hardener removed to expose underlying structure.

The structures 62, to which access is desired or required, are uncovered by selective removal of the flowable hardener 30, as indicated in operation D of FIG. 7. A plasma etch can be used for removal of an epoxy-based flowable hardener. The plasma etch will not, however, substantially attack the semiconductor stop-etch layer 56. As such, the flowable hardener surrounding the mesas 10 will be substantially preserved. FIG. 9 shows the structures 62 uncovered.

The stop-etch layer 56 can then be removed by a chemical etch that does not substantially attack the flowable-hardener 30. The etch may be timed or otherwise controlled by conventional methods so that the device layers are substantially preserved. A suitable etch for an AlGaAs-based stop-etch layer is $H_2O_2$:$H_3PO_4$:$H_2O$.

In an additional embodiment of a method according to the present invention, a stop-etch layer, such as the stop-etch layer 6 shown in FIG. 1, is omitted from the chip during patterning of the mesas 10. After substrate removal, a semiconductor-based stop-etch layer is disposed on the hardener, and then patterned to provide holes 58 to allow etchant to uncover the structures 62.

The ability to selectively uncover structures from the surrounding hardener advantageously provides a method for bulk fabrication of a plurality of identical or different circuits. After applying the above-described method to a wafer to form a plurality of such circuits, the wafer is sawed or otherwise physically separated, yielding a plurality of discrete circuits.

While embodiments of the invention have been described in detail, those embodiments are provided by way of illustration, not limitation. It will be evident to those skilled in the art that the present invention may be embodied otherwise without departing from its spirit and scope.

We claim:

1. A method of forming an integrated device, comprising the steps of:

bonding a first chip having a plurality of semiconductor devices and a substrate to a second chip;

flowing a flowable hardener to fill space between the first chip and the second chip and allowing the flowable hardener to harden;

removing substantially all of the substrate from the first chip; and selectively removing the hardened flowable hardener to expose structures disposed on the second chip, while substantially preserving the hardened flowable hardener immediately surrounding the semiconductor devices.

2. The method of claim 1 wherein the step of bonding further comprises the step of bonding metallized pads disposed on each semiconductor device of the plurality to bonding pads disposed on the second chip.

3. The method of claim 1 wherein the semiconductor devices are photonics devices.

4. The method of claim 1 wherein the flowable hardener is an epoxy.

5. The method of claim 1 wherein the step of selectively removing the hardened flowable hardener further comprises the step of delivering etchant to the hardened flowable hardener at selected sites.

6. The method of claim 5 wherein the selected sites are holes in a stop-etch layer, wherein the holes provide access to the hardened flowable hardener above the structures on the second chip.

7. The method of claim 6, further comprising the step of patterning the stop-etch layer to provide holes at the selected sites before bonding the first chip to the second chip.

8. The method of claim 6, further comprising the steps of:

applying a stop-etch layer on the hardened flowable hardener after the substrate has been substantially removed; and patterning holes in the stop-etch layer at the selected sites.

9. The method of claim 6 wherein the stop-etch layer is aluminum-gallium-arsenide.

10. The method of claim 6 wherein the flowable hardener is epoxy.

11. The method of claim 1 wherein the plurality of semiconductor devices define a second plurality of circuits.

12. The method of claim 11 further comprising the step of sawing the second chip to physically separate at least one circuit of the second plurality from other circuits of the plurality.

13. The method of claim 10 wherein at least one circuit of the second plurality has a different configuration than other circuits of the second plurality.

14. A method for batch fabrication of semiconductor circuits, comprising the steps of:

bonding a first chip having a first plurality of semiconductor devices and a substrate to a second chip having a second plurality of semiconductor devices thereby forming a third plurality of circuits based on the first and second plurality of semiconductor devices;

flowing a flowable hardener to fill space between the first chip and the second chip and allowing the flowable hardener to harden;

removing substantially all of the substrate from the first chip;

selectively removing the hardened flowable hardener to expose a fourth plurality of structures disposed on the second chip while substantially preserving the hardened flowable hardener immediately surrounding the semiconductor devices, wherein a first structure of the fourth plurality forms a part of a first circuit of the third plurality and a second structure of the fourth plurality forms a part of a second circuit of the third plurality; and physically separating the first circuit from the second circuit.

15. The method of claim 14 wherein the flowable hardener is an epoxy.

16. The method of claim 14 wherein the step of selectively removing the hardened flowable hardener further comprises the step of delivering etchant to the hardened flowable hardener at selected sites.

17. The method of claim 16 wherein the selected sites are holes in a stop-etch layer, wherein the holes provide access to the hardened flowable hardener above each structure of the fourth plurality of such structures.

18. The method of claim 17, further comprising the step of patterning the stop-etch layer to provide holes at the selected sites before bonding the first chip to the second chip.

19. The method of claim 17, further comprising the steps of:

applying a stop-etch layer on the hardened flowable hardener after the substrate has been removed; and patterning holes in the stop-etch layer at the selected sites.

* * * * *